United States Patent
Roohparvar

(10) Patent No.: US 7,450,422 B2
(45) Date of Patent: Nov. 11, 2008

(54) NAND ARCHITECTURE MEMORY DEVICES AND OPERATION

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 186 days.

(21) Appl. No.: 11/432,135

(22) Filed: May 11, 2006

(65) Prior Publication Data

US 2007/0263462 A1 Nov. 15, 2007

(51) Int. Cl.
*G11C 16/04* (2006.01)

(52) U.S. Cl. .......................... 365/185.17; 365/185.24; 365/185.25

(58) Field of Classification Search ............ 365/185.17, 365/185.24, 285.25
See application file for complete search history.

(56) References Cited

U.S. PATENT DOCUMENTS

| | | | |
|---|---|---|---|
| 5,392,238 A | 2/1995 | Kirisawa | |
| 5,568,421 A | 10/1996 | Aritome | |
| 5,680,347 A | 10/1997 | Takeuchi et al. | |
| 5,754,482 A | 5/1998 | Su et al. | |
| 5,781,478 A | 7/1998 | Takeuchi et al. | |
| 6,028,788 A * | 2/2000 | Choi et al. | 365/185.11 |
| 6,147,910 A | 11/2000 | Hsu et al. | |
| 6,859,397 B2 * | 2/2005 | Lutze et al. | 365/185.28 |
| 6,870,770 B2 | 3/2005 | Roohparvar | |
| 6,982,904 B2 | 1/2006 | Shiga | |
| 7,006,378 B1 * | 2/2006 | Saito et al. | 365/185.05 |
| 7,203,092 B2 | 4/2007 | Nazarian | |
| 2003/0032243 A1 | 2/2003 | Ogura et al. | |
| 2004/0174748 A1* | 9/2004 | Lutze et al. | 365/185.28 |
| 2004/0190338 A1* | 9/2004 | Lee | 365/185.05 |
| 2005/0036395 A1 | 2/2005 | Maejima et al. | |
| 2005/0185466 A1 | 8/2005 | Prall | |
| 2006/0039197 A1 | 2/2006 | Khouri et al. | |

FOREIGN PATENT DOCUMENTS

EP     1615229     1/2006

* cited by examiner

*Primary Examiner*—Thong Q Le
(74) *Attorney, Agent, or Firm*—Leffert Jay & Polglaze, P.A.

(57) ABSTRACT

Non-volatile memory devices utilizing a modified NAND architecture where ends of the NAND string of memory cells are selectively coupled to different bit lines may facilitate increased memory densities, reduced fabrication steps and faster read operations when compared to traditional NAND memory array architectures. Programming and erasing of the memory cells can be accomplished in the same manner as a traditional NAND memory array. However, reading of the memory cells may be accomplished using charge sharing techniques similar to read operations in a DRAM device.

55 Claims, 6 Drawing Sheets

US 7,450,422 B2
// 1

NAND ARCHITECTURE MEMORY DEVICES AND OPERATION

TECHNICAL FIELD OF THE INVENTION

The present invention relates generally to semiconductor memory devices, and in particular, the present invention relates to NAND architecture memory devices and their operation and use.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

As the performance of electronic systems employing flash memory devices increases, flash memory device performance should also increase. A performance increase includes reducing power consumption, increasing speed, and increasing the memory density.

For the reasons stated above, and for other reasons stated below which will become apparent to those skilled in the art upon reading and understanding the present specification, there is a need in the art for alternative NAND memory architectures and their operation.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The following detailed description is, therefore, not to be taken in a limiting sense, and the scope of the present invention is defined only by the appended claims and equivalents thereof.

Non-volatile memory devices are described utilizing a modified NAND architecture where ends of the NAND string of memory cells are selectively coupled to different bit lines. Programming and erasing of the memory cells can be accomplished in the same manner as a traditional NAND memory array. However, reading of the memory cells in accordance with embodiments of the invention is accomplished using charge sharing techniques similar to read operations in a DRAM device.

The NAND architectures of the various embodiments include strings of two or more series-coupled field-effect transistor non-volatile memory cells whose data values are determined by their threshold voltages. A first of the series-coupled memory cells of a string is selectively coupled to a first bit line through a first select gate. A last of the series-coupled memory cells of the string is selectively coupled to a second bit line through a second select gate. During a read operation of a target memory cell of string, the second or adjacent bit line serves as a storage node for a charge that is indicative of the data value of the target memory cell.

Figure 1:
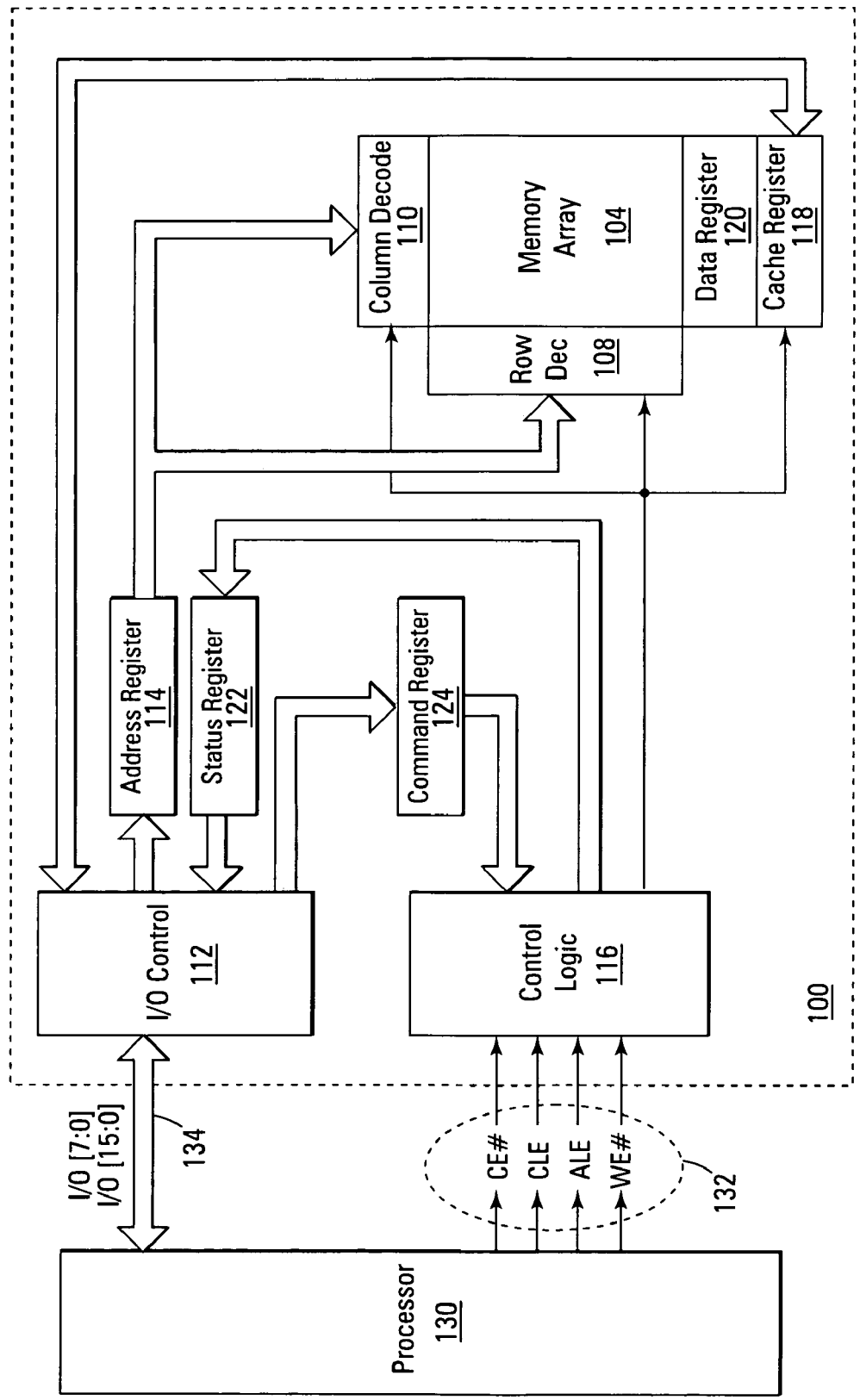
FIG. 1 is a functional block diagram of an electronic system having at least one memory device in accordance with an embodiment of the invention.

FIG. 1 is a simplified block diagram of a NAND flash memory device 100 coupled to a processor 130 as part of an electronic system, according to an embodiment of the invention. Some examples of electronic systems include personal computers, personal digital assistants (PDAs), digital cameras, digital media players, digital recorders, games, appliances, vehicles, wireless devices, cellular telephones and the like. The processor 130 may be a memory controller or other external processor. Memory device 100 includes an array of memory cells 104 arranged in rows and columns and having an architecture in accordance with an embodiment of the invention. A row decoder 108 and a column decoder 110 are provided to decode address signals. Address signals are received and decoded to access memory array 104. Memory device 100 also includes input/output (I/O) control circuitry 112 to manage input of commands, addresses and data to the memory device 100 as well as output of data and status information from the memory device 100. An address register 114 is coupled between I/O control circuitry 112 and row decoder 108 and column decoder 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decoder 108 and column decoder 110 to control the row decoder 108 and column decoder 110 in response to the addresses. Control logic 116 is also coupled to a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is coupled between I/O control circuitry 112 and control logic 116 to latch the status information for output to the processor 130.

Memory device 100 receives control signals at control logic 116 from processor 130 over a control link 132. The control signals may include a chip enable CE#, a command latch enable CLE, an address latch enable ALE, and a write enable WE# in accordance with the present invention. Memory device 100 receives command signals (or commands), address signals (or addresses), and data signals (or data) from processor 130 over a multiplexed input/output (I/O) bus 134 and outputs data to processor 130 over I/O bus 134.

Specifically, the commands are received over input/output (I/O) pins [0:7] of I/O bus 134 at I/O control circuitry 112 and are written into command register 124. The addresses are received over input/output (I/O) pins [0:7] of bus 134 at I/O control circuitry 112 and are written into address register 114. The data are received over input/output (I/O) pins [0:7] for an 8-bit device or input/output (I/O) pins [0:15] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [0:7] for an 8-bit device or input/output (I/O) pins [0:15] for a 16-bit device. It will be appreciated by those skilled in the art that additional circuitry and control signals can be provided, and that the memory device of FIG. 1 has been simplified to help focus on the invention. Additionally, while specific I/O pins are described in accordance with popular conventions for receipt and output of the various signals, it is noted that other combinations or numbers of I/O pins may be used in the various embodiments.

Figure 2:
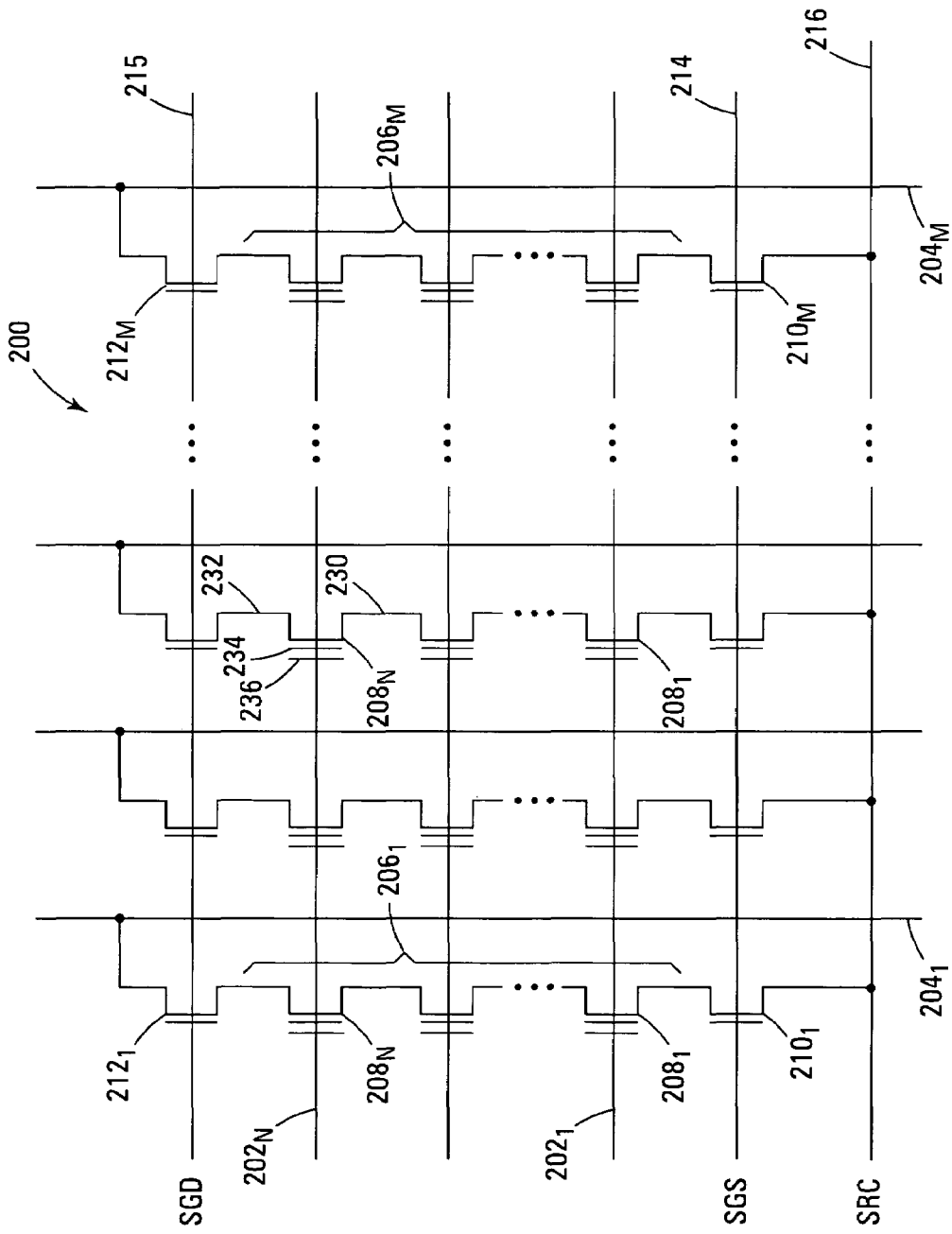
FIG. 2 is a schematic of a portion of an example NAND memory array of the prior art.

FIG. 2 is a schematic of a portion of an example NAND memory array 200 of the prior art included for comparison. As shown in FIG. 2, the memory array 200 includes word lines $202_1$ to $202_N$ and intersecting bit lines $204_1$ to $204_M$. For ease of addressing in the digital environment, the number of word lines 202 and the number of bit lines 204 are generally each some power of two.

Memory array 200 includes NAND strings $206_1$ to $206_M$. Each NAND string includes transistors $208_1$ to $208_N$, each located at an intersection of a word line 202 and a bit line 204. The transistors 208, depicted as floating-gate transistors in FIG. 2, represent non-volatile memory cells for storage of data. The floating-gate transistors 208 of each NAND string 206 are connected in series source to drain between a source select gate 210, e.g., a field-effect transistor (FET), and a drain select gate 212, e.g., a FET. Each source select gate 210 is located at an intersection of a bit line 204 and a source select line 214, while each drain select gate 212 is located at an intersection of a bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$.

The drain of each drain select gate 212 is connected to a bit line 204 for the corresponding NAND string. For example, the drain of drain select gate $212_1$ is connected to the bit line $204_1$ for the corresponding NAND string $206_1$. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given bit line 204. A row of the floating-gate transistors 208 are those transistors commonly coupled to a given word line 202.

To read memory cells in the prior art NAND architecture memory array of FIG. 2, unselected word lines of a block of memory cells are typically operated as pass gates while a selected word line receives a different control potential to allow its data state to determine the conductance of its associated strings of memory cells. In general, a word line associated with a selected row of memory cells is driven at a selected read level voltage Vread, which is typically a low voltage (such as 0V or ground). In addition, the word lines connected to the gates the unselected memory cells of each string are driven by a pass voltage Vpass (such as 4.5V) to operate the unselected memory cells of each string as pass gates. This allows them to pass current in a manner that is unrestricted by their stored data values. In a read operation, current then flows from the source line to the column bit line through each series-connected string, restricted only by the memory cell selected to be read in each string. The data value of a selected memory cell of a string is then determined by sensing a level of current flow through its associated string.

Figure 3A:
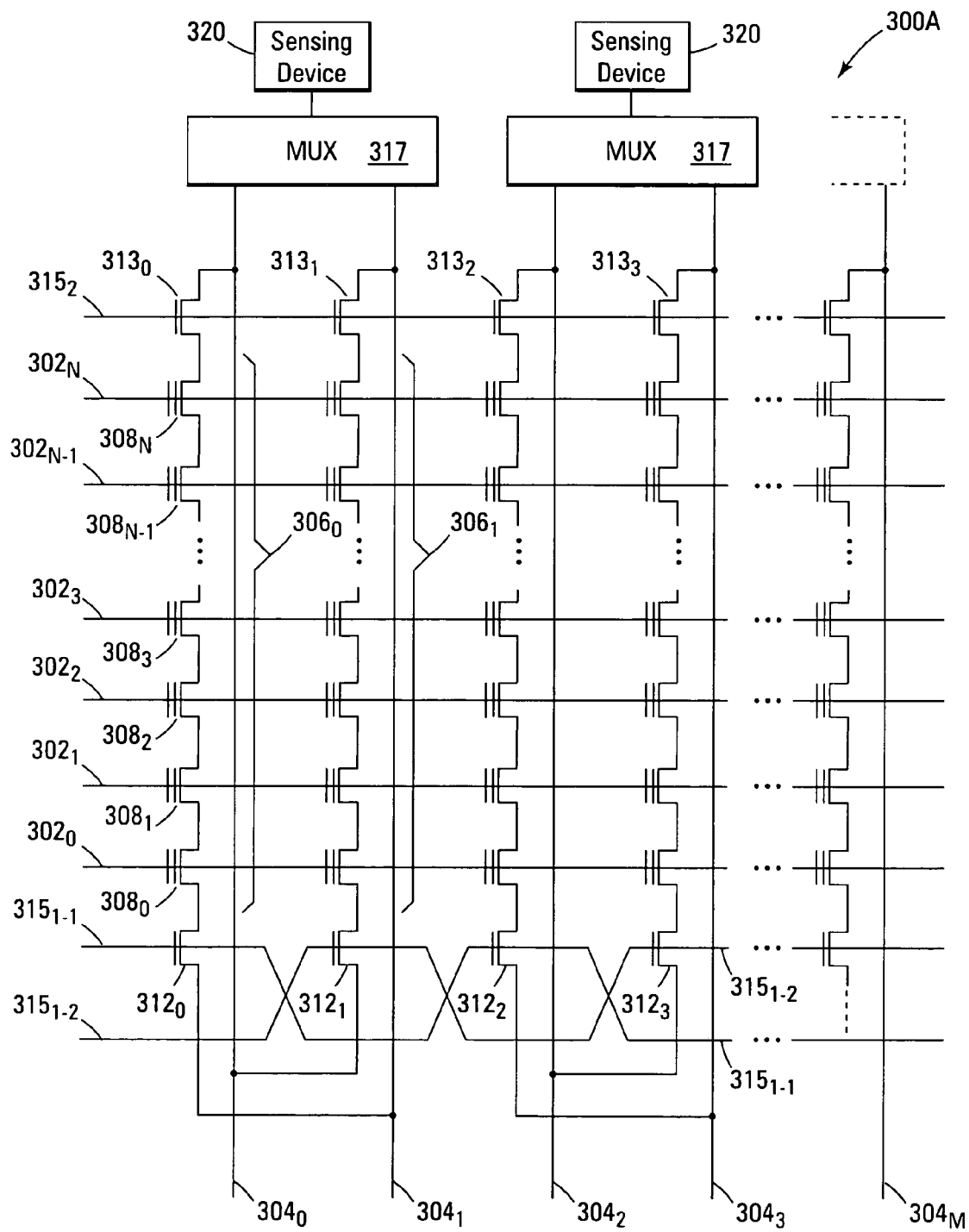
FIG. 3A is a schematic of a portion of a NAND memory array in accordance with an embodiment of the invention.

FIG. 3A is a schematic of a portion of a NAND memory array 300A in accordance with an embodiment of the invention. As shown in FIG. 3A, the memory array 300A includes word lines $302_0$ to $302_N$ and intersecting bit lines $304_0$ to $304_M$ using a layout similar to that of NAND memory array 200. For ease of addressing in the digital environment, the number of word lines 302 and the number of bit lines 304 are generally each some power of two.

Memory array 300A includes NAND strings $306_0$ and $306_1$. It is noted that typical memory arrays may contain millions of such strings 306 selectively coupled to bit lines 304 in a many to one relationship. Each NAND string 306 includes field-effect transistors $308_0$ to $308_N$, each located at an intersection of a word line 302 and a bit line 304. The transistors 308, depicted as floating-gate transistors in FIG. 3A, represent non-volatile memory cells for storage of data. Although the memory array 300A is depicted as an array of floating-gate transistors, other non-volatile memory technologies capable of defining a data value by a change in threshold voltage may also be used, such as NROM, floating-node, ferroelectric, magnetic and the like. Each data value typically corresponds to mutually exclusive ranges of threshold voltages. The floating-gate transistors 308 of each NAND string 306 are connected in series, sharing source/drain regions with adjacent memory cells, between a first select gate 312, e.g., a FET, and a second select gate 313, e.g., a FET. Each first select gate 312 is located at an intersection of a bit line 304 and first select lines $315_{1-1}$/$315_{1-2}$, while each second select gate 313 is located at an intersection of a bit line 304 and a second select line $315_2$. Unlike the traditional NAND memory array 200 of FIG. 2, the NAND memory array 300A in accordance with an embodiment of the invention has no select gate coupled to a source line. In contrast, the NAND memory array 300A has both select gates 312 and 313 of a NAND string 306 coupled to a bit line 304.

The NAND strings 306 are coupled to use a bit line 304 as a charge storage node for charge sharing during a read operation. For example, presume that NAND string $306_1$ is sensed using bit line $304_1$. That is, bit line $304_1$ is selectively coupled to a sensing device 320, such as by a multiplexer 317, when determining a data value of a target memory cell 308 in NAND string $306_1$. The multiplexer 317 selectively couples one bit line 304 to sensing device 320 while decoupling remaining bit lines 304. Although only two bit lines 304 are depicted coupled to multiplexer 317, additional levels of multiplexing may be used such that a sensing device 320 could be selectively coupled to one of many bit lines 304. NAND string $306_1$ will then use a second bit line, such as adjacent bit line $304_0$, as a charge storage node. Similarly, if NAND string $306_0$ is sensed using bit line $304_0$, it could use adjacent bit line $304_1$ as its charge storage node. While the NAND memory array 300A is depicted with a pair of NAND strings $306_0$/$306_1$ sharing the same pair of bit lines $304_0$/$304_1$, such is not a requirement. For example, NAND string $306_1$ could use a bit line to its right, i.e., bit line $304_2$, in a manner similar to the coupling of NAND string $306_0$ to bit line $304_1$. The bit line used as a charge storage node need only be decoupled from its sensing device when being used as a charge storage node for the bit line being sensed.

A first source/drain region of each first select gate 312 is connected to a bit line 304. A second source/drain region of each first select gate 312 is connected to a first source/drain region of the first floating-gate transistor 308 of the corresponding NAND string 306. For example, the first source/drain region of the first select gate $312_0$ is connected to bit line $304_1$ and the second source/drain region of the first select gate $312_0$ is connected to the first source/drain region of floating-gate transistor $308_0$ of the corresponding NAND string $306_0$. At the opposing end of the string, a second source/drain region of each second select gate 313 is connected to a different bit line 304 than its corresponding first source select gate 312 while a first source/drain region of each select gate 313 is connected to a second source/drain region of the last floating-gate transistor 308 of the corresponding NAND string 306. For example, the first source/drain region of source select gate $313_0$ is connected to second source/drain region of floating-gate transistor $308_N$ of the corresponding NAND string $306_0$ and the second source/drain region of the source select gate $313_0$ is connected to the bit line $304_0$.

In order to utilize a bit line 304 as a charge storage node, it must be isolated from the bit line being sensed except through the NAND string 306 containing the target memory cell 308. FIG. 3A depicts just one example of how this can be accomplished. For example, the first select gate $312_0$ associated with NAND string $306_0$ may receive a first control signal via first select line $315_{1-1}$ while first select gate $312_1$ associated with NAND string $306_1$ may receive a second control signal via first select line $315_{1-2}$. By applying complementary signals to the first select lines $315_{1-1}$ and $315_{1-1}$, NAND string $306_0$ could be coupled to bit line $304_1$ while NAND string $306_1$ is decoupled from bit line $304_0$ or vice versa. For increased isolation, similar treatment could be applied to the second select gates 313 to selectively decouple one NAND string 306 from both bit lines $304_0$ and $304_1$ while the other NAND string 306 is coupled to both.

Figure 3B:
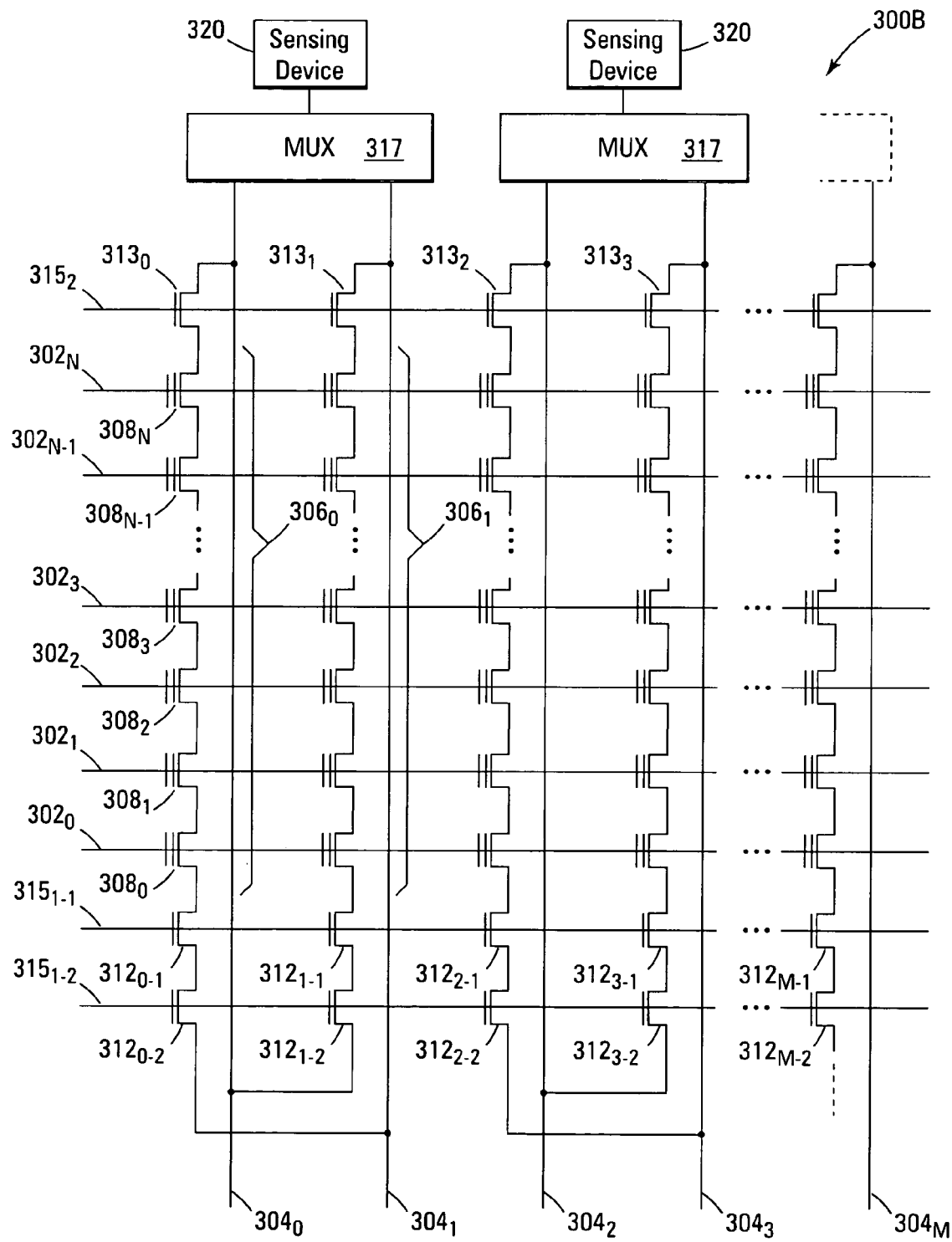
FIG. 3B is a schematic of a portion of a NAND memory array in accordance with another embodiment of the invention.

FIG. 3B is a schematic of a portion of a NAND memory array 300B in accordance with an embodiment of the invention. The memory array 300B has the substantially same basic layout as memory array 300A of FIG. 3A, but uses a different technique to selectively decouple one NAND string 306 from both bit lines $304_0$ and $304_1$ while the other NAND string 306 is coupled to both. For the embodiment of FIG. 3B, two rows of first select gates 312 are used, with each row of select gates 312 receiving the same control signal through a first select line $315_1$. However, the first select gates 312 of each row alternate between enhancement mode devices, i.e., in a normally deactivated state, and depletion mode devices, i.e., in a normally activated state. The differing device modes may be created by modifying doping levels in alternating devices. For example, as depicted in FIG. 3B, first select gate $312_{0-1}$ may be an enhancement mode device while the first select gate $312_{1-1}$ is a depletion mode device. Thus, a supply potential Vcc applied to select line $315_{1-1}$ would activate both first select gates $312_{0-1}$ and $312_{1-1}$ while a ground potential Vss applied to select line $315_{1-1}$ would deactivate first select gate $312_{0-1}$ and activate first select gate $312_{1-1}$. To allow for selective coupling of either bit line 304 in this example, the second row of first select gates 312 would alternate between enhancement mode and depletion mode devices, but use an opposite pattern from the first row. To continue with this example, first select gate $312_{0-2}$ would be a depletion mode device while first select gate $312_{1-2}$ would be an enhancement mode device. Stated alternately, even select gates of a first row of select gates 312 and odd select gates of a second row of select gates 312 would be enhancement mode devices while odd select gates of the first row of select gates 312 and even select gates of the second row of select gates 312 would be depletion mode devices. Thus, in the example embodiment, a supply potential Vcc applied to select line $315_{1-2}$ would activate both first select gates $312_{0-2}$ and $312_{1-2}$ while a ground potential Vss applied to select line $315_{1-2}$ would deactivate first select gate $312_{0-2}$ and activate first select gate $312_{1-2}$. In this manner, applying the supply potential Vcc to the select line $315_{1-1}$ and the ground potential Vss to select line $315_{1-2}$ would couple NAND string $306_0$ to bit line $304_1$ and isolate NAND string $306_1$ from bit line $304_0$. Conversely, applying the ground potential Vss to the select line $315_{1-1}$ and the supply potential Vcc to select line $315_{1-2}$ would couple NAND string $306_1$ to bit line $304_0$ and isolate NAND string $306_0$ from bit line $304_1$. Because the first select gates 312 act in a coordinated manner, a pair of enhancement mode and depletion mode devices associated with a single NAND string 306, e.g., first select gates $312_{0-1}$ and $312_{0-2}$, may be referred to collectively as a first select gate 312, e.g., first select gate $312_0$, for purposes of this disclosure. As noted with the embodiment of FIG. 3A, the same treatment could be applied to the other end of the NAND strings 306 to achieve additional levels of isolation.

It may be desirable or necessary to provide for isolation at both ends of each NAND string 306 from the bit lines 304. By applying the ground potential Vss to both select lines $315_{1-1}$ and $315_{1-2}$, or applying a negative control voltage to either select line $315_{1-1}$ or $315_{1-2}$, at least one first select gate 312 would be deactivated for each NAND string 306. While various examples were described to facilitate use of bit lines 304 as charge storage nodes, other methods could be used to produce the same or substantially similar results.

For FIGS. 3A and 3B, a column of the transistors or memory cells 308 are those NAND strings 306 coupled to a given bit line 304. A row of the transistors or memory cells 308 are those transistors commonly coupled to a given word line 302. Other forms of transistors 308 may also be utilized with embodiments of the invention, such as NROM, magnetic or ferroelectric transistors and other transistors capable of being programmed to assume one of two or more threshold voltages indicative of data states.

By eliminating the need for a source and source connection, memory arrays in accordance with embodiments of the invention can be fabricated using less die area and fewer processing steps, thus facilitating increased yield and higher memory densities. In addition, because traditional NAND memory arrays 200 rely on conductance of its NAND strings 206 for read operations, larger string lengths are discouraged due to the increases in resistance which tend to increase read times and make it more difficult to distinguish between different data values. However, as will be explained in more detail below, because NAND memory arrays in accordance with embodiments of the invention rely on capacitance of bit lines 304 for read operations rather than conductance, string length has only nominal impact on the read performance.

Programming and erasing memory cells 308 of the NAND arrays 300 can be performed similar to programming and erasing memory cells 208 of the prior-art NAND array 200. For example, to program a target floating-gate memory cell $308_1$, i.e., to increase its threshold voltage by adding charge to its floating gate, the word line $302_1$ containing the target memory cell $308_1$ may receive a programming voltage that is some positive potential capable of programming a memory cell in conjunction with the remaining node voltages. For example, the programming voltage may be about 20V. Unselected word lines 302, i.e., word lines $302_0$ and $302_2$-$302_N$ not associated with the target memory cell $308_1$, receive some positive potential capable of causing memory cells on the unselected word lines to act as pass gates during the programming of the selected word line. The pass voltage during programming may be about 10V. The selected bit line 304, i.e., the bit line $304_0$ associated with the target memory cell $308_1$, might receive the ground potential Vss while unselected bit lines 304, e.g., bit lines $304_1$-$304_M$ not associated with the target memory cell $308_1$, might receive a higher potential, such as the supply potential Vcc. Note that while this example describes programming only one target memory cell 308, there may be more than one selected bit line 304 as more than one target memory cell 308 on a given word line 302 can be programmed concurrently.

One set of select gates, such as first select gates 312 or isolation gates 314, if used, might receive the same potential as the selected bit lines 304, such as ground potential Vss, on their gates. An opposing set of select gates, such as second select gates 313 might receive some positive potential, such as the supply potential Vcc, on their gates sufficient to activate those select gates coupled to selected bit lines. The bulk substrate in which the memory cells 308 are formed might be held at the ground potential Vss.

Erasing of memory cells 308 would generally be performed concurrently to a block of memory cells. For example, to erase the floating-gate memory cell 308, i.e., to decrease their threshold voltages by removing charge from their floating gates, all word lines 302 might receive the ground potential Vss, all bit lines 304 may be electrically floating, and the select lines may be electrically floating while the bulk substrate in which the memory cells 308 are formed is boosted to some erase voltage, such as 20V.

The foregoing represents just one set of techniques for programming and erasing memory cells of a NAND memory array 300 of the type depicted in FIGS. 3A and 3B. It is noted that because typical programming and erase operations do not make use of the source connection of a traditional NAND memory array, many techniques for programming and erasing a traditional NAND memory array 200 can also be applied to NAND memory arrays 300A/300B in accordance with embodiments of the invention. However, because the NAND strings 306 in accordance with embodiments of the invention eliminate the need for a source connection, typical read operations relying on conductance of a string of memory cells are unsuitable for use with embodiments of the invention.

In contrast to traditional read operations of NAND memory arrays, various embodiments of the invention rely on capacitance of a bit line during a read operation. A charge is placed on a bit line not containing the target memory cell and then selectively released or increased depending upon the data value stored in the target memory cell. The target memory cell or cells are then read using charge sharing techniques to raise or lower a voltage on their associated bit lines. If the charge on the bit line not containing the target memory cell is greater than the bit line associated with the target memory cell, the associated bit line receives the charge and increases its voltage level. If the charge is less, the associated bit line loses charge to the storage node bit line and decreases its voltage level. Because no DC current flows through the NAND strings 306 for the read operation, significant power savings can be facilitated over traditional read operations based on current flow. Additionally, the time expected for precharging the strings of memory cells, selectively releasing or increasing the charge and reading the data value using charge sharing techniques is expected to be on the order of several hundred nanoseconds versus several microseconds used for traditional conductance read operations.

Figure 4:
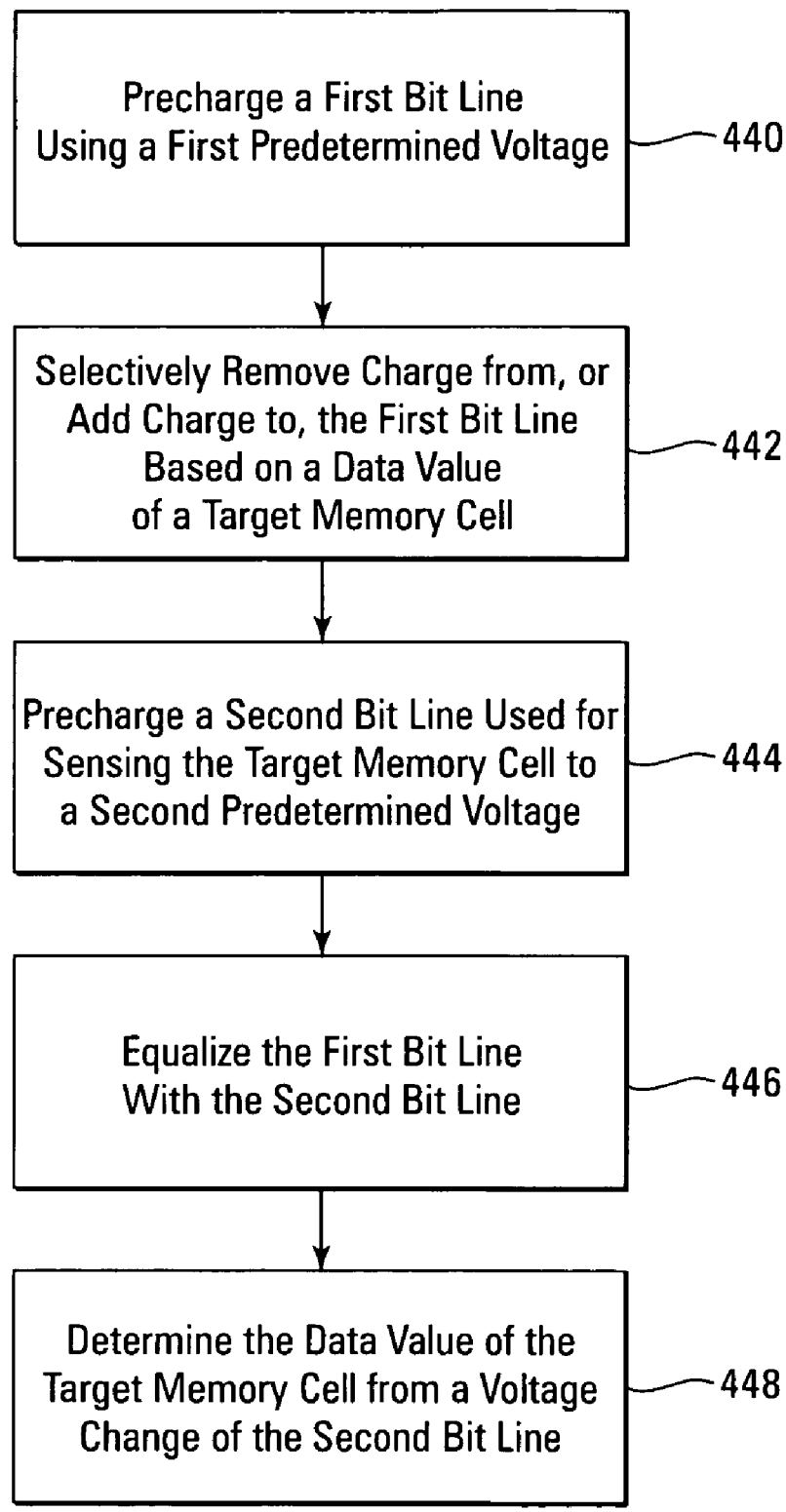
FIG. 4 is a flow chart of a method of reading memory cells in accordance with an embodiment of the invention.

FIG. 4 is a flow chart of a method of reading memory cells in accordance with an embodiment of the invention. At 440, a first bit line, i.e., the bit line being used as a storage node, is precharged using a first predetermined voltage. Typically, a read operation would read memory cells 308 coupled to a selected word line 302 across a number of bit lines 304. For example, a read operation may be performed on every other bit line of a block of memory cells. In such a case, the remaining bit lines could be used as storage nodes and thus each could be precharged using the first predetermined voltage. For example, if the target memory cell is in NAND string $306_0$, the bit line $304_1$ could be precharged using the first predetermined voltage.

In the foregoing example, the bit line $304_1$ could be driven to the first predetermined voltage, such as the supply potential Vcc or the ground potential Vss, while the bit line $304_1$ is isolated from the NAND strings $306_0$ and $306_1$. After precharging, the bit line $304_1$ would be isolated, thus retaining its charge. Note that the stored charge may be a positive, negative or neutral charge depending upon the chosen voltage.

At 442, charge stored on the first bit lines is selectively removed or added based on the data values of the target memory cells. To selectively remove charge from, or add charge to, a bit line 304 acting as a charge storage node, the NAND string 306 containing the target memory is made conductive if the target memory cell has a first data value and non-conductive if it has a second data value and the first select gate 312 between the bit line 304 and the NAND string 306 is activated. Charge can then be selectively removed or added through the NAND string 306 depending upon the data value of the target memory cell. The following example describes how charge can be selectively removed where the bit line acting as a charge storage node has been precharged using a positive voltage, such as Vcc. For this example, the selected word line $302_1$ coupled to the target memory cell $308_1$ may receive a potential to activate the memory cell if it has a first data value, e.g., "1" or erased, and to deactivate the memory cell if it has a second data value, e.g., "0" or programmed. For example, in floating-gate memory cells, an erased memory cell generally has a threshold voltage of less than 0V while a programmed memory cell might have a threshold voltage of around 1V or higher. Thus, by applying the ground potential Vss to the selected word line $302_1$, the target memory cell $308_1$ will be activated if it has the first data value and deactivated if it has the second data value. Remaining word lines 302 would receive a potential to activate their memory cells regardless of their data values, and first select gate $312_0$ and second select gate $313_0$ would receive a potential to activate these select gates. By dropping the bit line $304_0$ to the ground potential Vss, while the select gate $313_0$ is activated, the select gate $312_0$ is activated and the unselected word lines are acting as pass gates, the bit line $304_1$ would lose its charge to the bit line $304_0$ if the memory cell $308_1$ were activated. However, if the memory cell $308_1$ were deactivated, charge would be retained in the bit line $304_1$. A similar process could be used in this example to selectively add charge to the charge storage node. For example, the bit line $304_1$ could be precharged using the ground potential Vss. By placing the supply potential Vcc on the bit line $304_0$ and selectively coupling the bit line $304_0$ to the bit line $304_1$ based on the data value of the memory cell $308_1$, charge would be added to the bit line $304_1$ if the target memory cell $308_1$ were activated and charge would be retained if the memory cell $308_1$ were deactivated.

At 444, the second bit lines 304 to be read or sensed are precharged to a second predetermined voltage. The precharging may occur with the NAND strings 306 isolated from the second bit lines 304, such as by deactivating both select gates 312 and 313. Alternatively, the precharging may occur with the NAND strings 306 coupled to the second bit lines 304 being sensed provided that the bit lines 304 acting as storage nodes are isolated from the NAND strings 306.

For one embodiment, the second predetermined voltage is an intermediate value between the first predetermined voltage and the bit line voltage used when selectively removing or adding charge from the first bit lines acting as storage nodes. In this manner, if a stored charge is retained, charge sharing will tend to drive the bit line being sensed in one direction from the second predetermined voltage, and if the stored charge is removed or added, charge sharing will tend to drive the bit line being sensed in an opposite direction from the second predetermined voltage. For example, if the bit line $304_1$ was charged to the supply potential Vcc, and the resulting stored charge were retained, sharing the stored charge from the bit line $304_1$ would tend to increase the potential of a bit line $304_0$ if it were precharged to a second predetermined voltage of less than Vcc. Similarly, if the bit line $304_1$ was discharged to the ground potential Vss, charge sharing with the bit line $304_0$ would tend to decrease the potential of the bit line $304_0$ if it were precharged to a second predetermined voltage of greater than Vss. In this example, the second predetermined voltage would then be chosen to be some value greater than approximately Vss and less than approximately Vcc. For example, a second predetermined voltage of approximately Vcc/2 might be used in this scenario. For some embodiments, the second predetermined voltage may further have a value equal to the bit line voltage used when selectively removing charge from the NAND strings. However, in this scenario, if the charge is removed at 442, the data value of the memory cell would be indicated by no change in the second bit line voltage upon equalization with the first bit line. Similarly, for some embodiments, the second predetermined voltage may further have a value equal to the first predetermined voltage. However, in this scenario, if the charge is retained at 442, the data value of the memory cell would be indicated by no change in the second bit line voltage upon equalization with the first bit line.

At 446, charge sharing occurs between the first bit lines and the second bit lines by equalizing the two. As one example, charge sharing might be accomplished by driving all word lines 302 to the pass voltage Vpass to act as pass gates while activating both of the select gates 312 and 313.

At 448, the data values of the target memory cells 308 are determined based on the resulting voltage changes of their associated bit lines 304. Sensing of data values in this manner is well understood and is commonly utilized in DRAM devices. As one example, a differential sensing technique could be utilized. In this technique, during the precharging of the bit line at 444, a reference bit line could also be precharged and equalized to the bit line being sensed. The reference bit line would be isolated from the second bit line being sensed before performing the charge sharing at 446. By coupling the reference bit line and the second bit line being sensed to a differential sense amplifier, after sharing charge with the first bit line, it can be determined whether the second bit line being sensed has experienced a voltage increase or a voltage decrease relative to the reference bit line. This change is indicative of the data value of the target memory cell. Alternatively, single-ended sensing techniques may also be used. A single-ended sensing device has a single input coupled to a target bit line and often contains an inverter providing an output signal indicative of the potential level of the target bit line and, thus, the data value of the target memory cell. The inverter would generally have a threshold point close to the precharge potential.

Figure 5:
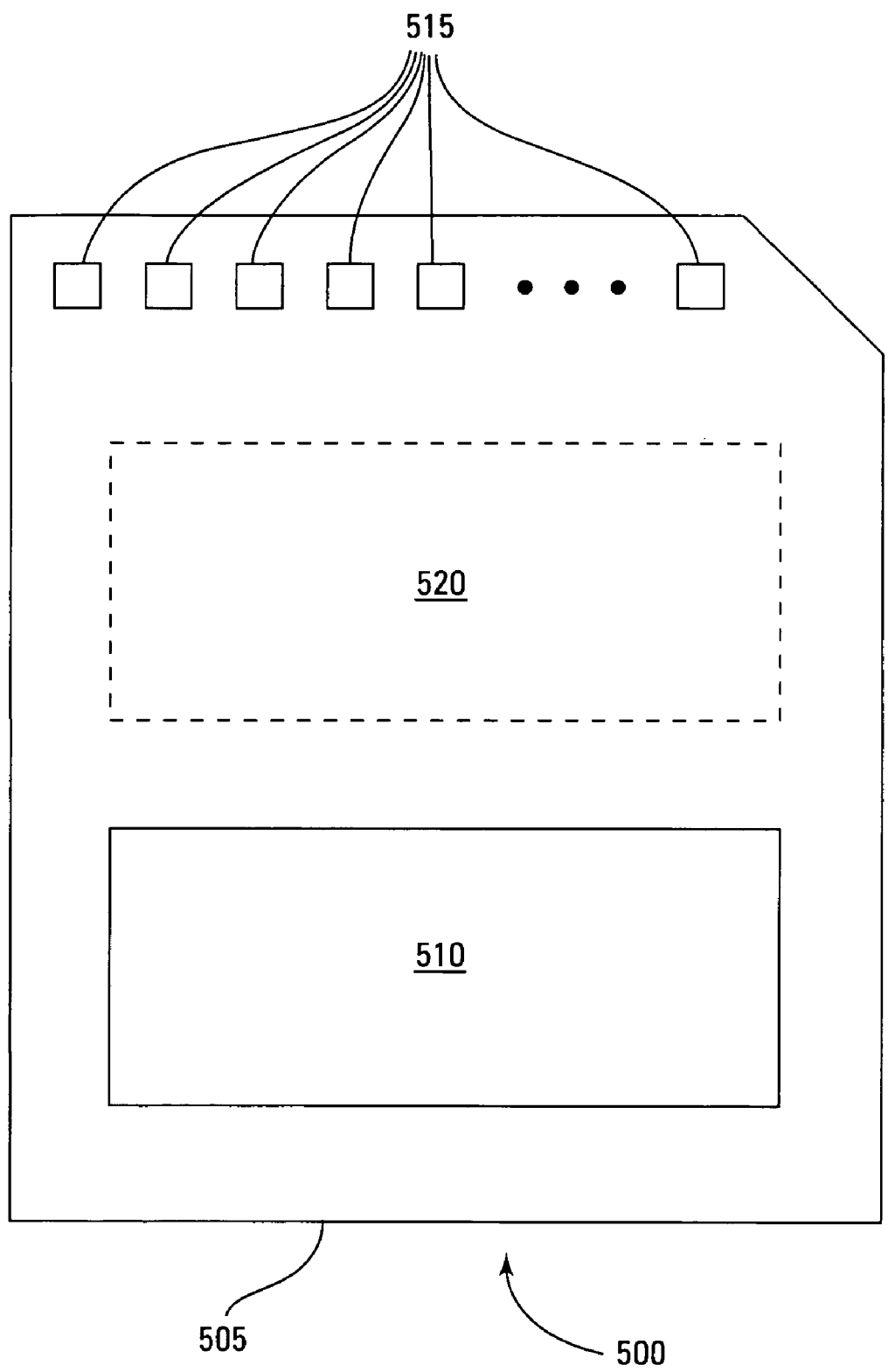
FIG. 5 is a functional block diagram of a memory module having at least one memory device in accordance with an embodiment of the invention.

FIG. 5 is an illustration of an exemplary memory module 500. Memory module 500 is illustrated as a memory card, although the concepts discussed with reference to memory module 500 are applicable to other types of removable or portable memory, e.g., USB flash drives, and are intended to be within the scope of "memory module" as used herein. In addition, although one example form factor is depicted in FIG. 5, these concepts are applicable to other form factors as well.

In some embodiments, memory module 500 will include a housing 505 (as depicted) to enclose one or more memory devices 510, though such a housing is not essential to all devices or device applications. At least one memory device 510 is a non-volatile memory having a NAND architecture in accordance with an embodiment of the invention. Where present, the housing 505 includes one or more contacts 515 for communication with a host device. Examples of host devices include digital cameras, digital recording and playback devices, PDAs, personal computers, memory card readers, interface hubs and the like. For some embodiments, the contacts 515 are in the form of a standardized interface. For example, with a USB flash drive, the contacts 515 might be in the form of a USB Type-A male connector. For some embodiments, the contacts 515 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 515 provide an interface for passing control, address and/or data signals between the memory module 500 and a host having compatible receptors for the contacts 515.

The memory module 500 may optionally include additional circuitry 520 which may be one or more integrated circuits and/or discrete components. For some embodiments, the additional circuitry 520 may include a memory controller for controlling access across multiple memory devices 510 and/or for providing a translation layer between an external host and a memory device 510. For example, there may not be a one-to-one correspondence between the number of contacts 515 and a number of I/O connections to the one or more memory devices 510. Thus, a memory controller could selectively couple an I/O connection (not shown in FIG. 5) of a memory device 510 to receive the appropriate signal at the appropriate I/O connection at the appropriate time or to provide the appropriate signal at the appropriate contact 515 at the appropriate time. Similarly, the communication protocol between a host and the memory module 500 may be different than what is required for access of a memory device 510. A memory controller could then translate the command sequences received from a host into the appropriate command sequences to achieve the desired access to the memory device 510. Such translation may further include changes in signal voltage levels in addition to command sequences.

The additional circuitry 520 may further include functionality unrelated to control of a memory device 510 such as logic functions as might be performed by an ASIC (application specific integrated circuit). Also, the additional circuitry 520 may include circuitry to restrict read or write access to the memory module 500, such as password protection, biometrics or the like. The additional circuitry 520 may include circuitry to indicate a status of the memory module 500. For example, the additional circuitry 520 may include functionality to determine whether power is being supplied to the memory module 500 and whether the memory module 500 is currently being accessed, and to display an indication of its status, such as a solid light while powered and a flashing light while being accessed. The additional circuitry 520 may further include passive devices, such as decoupling capacitors to help regulate power requirements within the memory module 500.

CONCLUSION

NAND memory array architectures having series-coupled strings of non-volatile memory cells where ends of the string are selectively coupled to different bit lines, and methods of reading a NAND memory array using charge sharing techniques, have been described. Such methods and apparatus facilitate increased memory densities, reduced fabrication steps and faster read operations when compared to traditional NAND memory array architectures.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A NAND memory array, comprising:
   at least two bit lines; and
   at least two strings of series-coupled non-volatile memory cells;
   wherein a first end of a first string of series-coupled non-volatile memory cells is selectively coupled to a first bit line with no intervening memory cells;
   wherein a second end of the first string of series-coupled non-volatile memory cells is selectively coupled to a second bit line with no intervening memory cells;
   wherein a first end of a second string of series-coupled non-volatile memory cells is selectively coupled to the second bit line with no intervening memory cells; and
   wherein the first end of the first string of series-coupled non-volatile memory cells and the first end of the second string of series-coupled non-volatile memory cells are selectively coupled to the first bit line and the second bit line, respectively, in response to a single control signal.

2. The NAND memory array of claim 1, further comprising:
   wherein a second end of the second string of series-coupled non-volatile memory cells is selectively coupled to the first bit line with no intervening memory cells.

3. The NAND memory array of claim 1, further comprising:
   wherein a second end of the second string of series-coupled non-volatile memory cells is selectively coupled to a third bit line with no intervening memory cells.

4. The NAND memory array of claim 3, wherein the first bit line is adjacent the second bit line and the second bit line is adjacent the third bit line.

5. The NAND memory array of claim 1, wherein the at least one string of series-coupled non-volatile memory cells comprises a plurality of field-effect transistors coupled source to drain.

6. The NAND memory array of claim 5, wherein the plurality of field-effect transistors are capable of defining a data value by a change in threshold voltage.

7. A NAND memory array, comprising:
   an array of non-volatile memory cells arranged in rows and columns;
   a plurality of bit lines selectively coupled to columns of the memory cells; and
   a plurality of word lines coupled to rows of the memory cells;
   wherein the columns of the memory cells are further grouped into strings of memory cells, each string comprising a plurality of memory cells coupled in a serial fashion between two select gates with each of the select gates coupled to a different bit line; and
   wherein at least two select gates of adjacent strings of memory cells are coupled to receive the same control signal.

8. The NAND memory array of claim 7, wherein a string of memory cells has its select gates coupled to two adjacent bit lines.

9. The NAND memory array of claim 7, wherein two adjacent strings of memory cells have their select gates coupled to the same pair of bit lines.

10. The NAND memory array of claim 9, further comprising:
    wherein a first string of memory cells of the two adjacent strings has a first select gate coupled to a first bit line of the pair of bit lines;
    wherein a second string of memory cells of the two adjacent strings has a first select gate coupled to a second bit line of the pair of bit lines;
    wherein the first select gate of the first string of memory cells and the first select gate of the second string of memory cells each receive the same control signal; and
    wherein when the first select gate of the first string of memory cells is activated in response to the control signal, the first select gate of the second string of memory cells is deactivated in response to the control signal.

11. The NAND memory array of claim 7, wherein the plurality of memory cells coupled in a serial fashion between two select gates further comprises a plurality of field-effect transistors coupled source to drain and each capable of defining a data value by a change in threshold voltage.

12. A NAND memory array, comprising:
an array of non-volatile memory cells arranged in rows and columns, each memory cell comprising a field-effect transistor capable of being programmed to have one of two or more mutually exclusive ranges of threshold voltages;
a plurality of bit lines selectively coupled to columns of the memory cells; and
a plurality of word lines coupled to rows of the memory cells;
wherein the columns of the memory cells are further grouped into strings of memory cells;
wherein a first string of the memory cells comprises a plurality of memory cells coupled source to drain;
wherein a first memory cell of the first string of memory cells has a source/drain region coupled to a first source/drain region of a first select gate;
wherein a last memory cell of the first string of memory cells has a source/drain region coupled to a first source/drain region of a second select gate;
wherein the first select gate of the first string of memory cells has a remaining source/drain region coupled to a first bit line;
wherein the second select gate of the first string of memory cells has a remaining source/drain region coupled to a second bit line;
wherein a second string of the memory cells comprises a plurality of memory cells coupled source to drain;
wherein a first memory cell of the second string of memory cells has a source/drain region coupled to a first source/drain region of a first select gate of the second string of memory cells;
wherein the first select gate of the second string of memory cells has a remaining source/drain region coupled to the second bit line; and
wherein the first select gate of the first string of memory cells and the first select gate of the second string of memory cells are coupled to receive the same control signal.

13. The NAND memory array of claim 12, further comprising:
wherein a last memory cell of the second string of memory cells has a source/drain region coupled to a first source/drain region of a second select gate of the second string of memory cells; and
wherein the second select gate of the second string of memory cells has a remaining source/drain region coupled to a bit line selected from the group consisting of the first bit line and a third bit line.

14. The NAND memory array of claim 13, wherein the first bit line is adjacent the second bit line and the second bit line is adjacent the third bit line.

15. The NAND memory array of claim 12,
wherein at least one of the second select gates of the first or second strings of memory cells comprises:
two field-effect transistors coupled in series;
wherein a first field-effect transistor has a first source/drain region coupled to a source/drain region of its corresponding last memory cell;
wherein a second field-effect transistor has a first source/drain region coupled to a second source/drain region of the first field-effect transistor and a second source/drain region coupled to its corresponding bit line; and
wherein one of the first and second field-effect transistors is an enhancement mode device and the other one of the first and second field-effect transistors is a depletion mode device.

16. The NAND memory array of claim 15, wherein when the first field-effect transistor of the second select gate of the first string of memory cells is an enhancement mode device, the first field-effect transistor of the second select gate of the second string of memory cells is a depletion mode device.

17. A method of reading a target memory cell of a string of series-coupled memory cells, the method comprising:
precharging a first bit line using a first predetermined voltage;
selectively removing charge from, or adding charge to, the first bit line based on a data value of the target memory cell;
precharging a second bit line to a second predetermined voltage;
equalizing the first bit line with the second bit line; and
determining the data value of the target memory cell in response to a voltage change of the second bit line after equalizing with the first bit line.

18. The method of claim 17, wherein the first predetermined voltage is a positive potential.

19. The method of claim 18, wherein the first predetermined voltage is the supply potential Vcc and charge is selectively removed from the first bit line based on the data value of the target memory cell.

20. The method of claim 17, wherein the first predetermined voltage is the ground potential Vss and charge is selectively added to the first bit line based on the data value of the target memory cell.

21. The method of claim 17, wherein selectively removing charge from the first bit line further comprises:
applying a ground potential to the second bit line;
applying a read voltage to the target memory cell adapted to activate the target memory cell if it has a first data value and to deactivate the target memory cell if it has a second data value;
activating remaining memory cells of the string of memory cells; and
coupling the first bit line and the second bit line to the string of memory cells while the target memory cell receives the read voltage.

22. The method of claim 17, wherein selectively adding charge to the first bit line further comprises:
applying a supply potential to the second bit line;
applying a read voltage to the target memory cell adapted to activate the target memory cell if it has a first data value and to deactivate the target memory cell if it has a second data value;
activating remaining memory cells of the string of memory cells; and
coupling the first bit line and the second bit line to the string of memory cells while the target memory cell receives the read voltage.

23. A method of reading a target memory cell of a string of series-coupled memory cells, the method comprising:
precharging a first bit line selectively coupled to one end of the string of memory cells using a first predetermined voltage;
selectively removing charge from, or adding charge to, the first bit line based on a data value of the target memory cell;
precharging a second bit line selectively coupled to an opposite end of the string of memory cells to a second predetermined voltage;

equalizing the first bit line with the second bit line; and
determining the data value of the target memory cell in response to a voltage change of the second bit line after equalizing with the first bit line.

24. A method of reading a target memory cell in a string of series-coupled memory cells, comprising:
   precharging a first bit line selectively coupled to one end of the string of memory cells to a first voltage;
   applying a second voltage to a second bit line;
   applying a gate voltage to the target memory cell adapted to activate the target memory cell if it has a first data value and adapted to deactivate the target memory cell if it has a second data value;
   activating remaining memory cells in the string of series-coupled memory cells regardless of data values stored in the remaining memory cells;
   coupling one end of the string of memory cells to the first bit line while coupling the other end of the string of memory cells to the second bit line;
   after coupling one end of the string of memory cells to the first bit line while coupling the other end of the sting of memory cells to the second bit line, isolating at least one of the first bit line and the second bit line from the string of memory cells;
   precharging the second bit line to a third voltage;
   coupling the first bit line to the second bit line; and
   determining the data value of the target memory cell in response to a voltage level of the second bit line after coupling with the first bit line.

25. The method of claim 24, wherein the third voltage is an intermediate voltage between the first voltage and the second voltage.

26. The method of claim 25, wherein the first voltage is a positive potential and the second voltage is a ground potential.

27. The method of claim 25, wherein the first voltage is a ground potential and the second voltage is a positive potential.

28. The method of claim 24, wherein the third voltage is equal to either the first voltage or the second voltage.

29. The method of claim 28, wherein determining the data value of the target memory cell in response to a voltage level of the second bit line further comprises determining whether the voltage level has changed.

30. The method of claim 24, wherein determining the data value of the target memory cell in response to a voltage level of the second bit line further comprises determining the data value using differential or single-ended sensing.

31. A memory device, comprising:
   an array of non-volatile memory cells having series-coupled strings of non-volatile memory cells selectively coupled to two bit lines; and
   circuitry for control and/or access of the array of non-volatile memory cells, wherein the circuitry for control and/or access is configured to perform a method of reading a target memory cell of a string of series-coupled memory cells, the method comprising:
      precharging a first bit line using a first predetermined voltage;
      selectively removing charge from, or adding charge to, the first bit line based on a data value of the target memory cell;
      precharging a second bit line to a second predetermined voltage;
      equalizing the first bit line with the second bit line; and
      determining the data value of the target memory cell in response to a voltage level of the second bit line after equalizing with the first bit line.

32. A memory device, comprising:
   an array of non-volatile memory cells having series-coupled strings of non-volatile memory cells selectively coupled to two bit lines; and
   circuitry for control and/or access of the array of non-volatile memory cells, wherein the circuitry for control and/or access is configured to perform a method of reading a target memory cell of a string of series-coupled memory cells, the method comprising:
      precharging a first bit line selectively coupled to one end of the string of memory cells using a first predetermined voltage;
      selectively removing charge from, or adding charge to, the first bit line based on a data value of the target memory cell;
      precharging a second bit line selectively coupled to an opposite end of the string of memory cells to a second predetermined voltage;
      equalizing the first bit line with the second bit line; and
      determining the data value of the target memory cell in response to a voltage level of the second bit line after equalizing with the first bit line.

33. A memory device, comprising:
   an array of non-volatile memory cells having series-coupled strings of non-volatile memory cells; and
   circuitry for control and/or access of the array of non-volatile memory cells;
   wherein the array of non-volatile memory cells comprises:
      two bit lines selectively coupled to a first series-coupled string of non-volatile memory cells; and
      wherein a first end of the first series-coupled string of non-volatile memory cells is selectively coupled to a first bit line;
      wherein a second end of the first series-coupled string of non-volatile memory cells is selectively coupled to a second bit line;
      wherein a first end of a second series-coupled string of non-volatile memory cells is selectively coupled to the second bit line;
      wherein the first end of the first series-coupled string of non-volatile memory cells is selectively coupled to the first bit line and the first end of the second series-coupled string of non-volatile memory cells is selectively coupled to the second bit line in response to the same control signal; and
      wherein neither the first end nor the second end of the first series-coupled string of non-volatile memory cells is selectively coupled to a source line.

34. The memory device of claim 33, further comprising:
   wherein a second end of the second series-coupled string of non-volatile memory cells is selectively coupled to the first bit line.

35. The memory device of claim 33, further comprising:
   wherein a second end of the second series-coupled string of non-volatile memory cells is selectively coupled to a third bit line.

36. A memory device, comprising:
   an array of non-volatile memory cells having series-coupled NAND strings of non-volatile memory cells; and
   circuitry for control and/or access of the array of non-volatile memory cells;
   wherein at least one NAND string comprises:

a first select gate for selectively coupling one end of the NAND string to a first bit line; and a second select gate for selectively coupling an opposite end of the NAND string to a second bit line, the second select gate comprising a first field-effect transistor and a second field-effect transistor coupled in series;

wherein one of the first and second field-effect transistors is an enhancement mode device and the other one of the first and second field-effect transistors is a depletion mode device.

37. A memory module, comprising:

a plurality of contacts; and two or more memory devices, each having access lines selectively coupled to the plurality of contacts;

wherein at least one of the memory devices comprises:

an array of non-volatile memory cells having series-coupled strings of non-volatile memory cells selectively coupled to two bit lines; and circuitry for control and/or access of the array of non-volatile memory cells, wherein the circuitry for control and/or access is configured to perform a method of reading a target memory cell of a string of series-coupled memory cells, the method comprising:

precharging a first bit line using a first predetermined voltage;

selectively removing charge from, or adding charge to, the first bit line based on a data value of the target memory cell;

precharging a second bit line to a second predetermined voltage;

equalizing the first bit line with the second bit line; and determining the data value of the target memory cell in response to a voltage level of the second bit line after equalizing with the first bit line.

38. A memory module, comprising:

a plurality of contacts; and two or more memory devices, each having access lines selectively coupled to the plurality of contacts;

wherein at least one of the memory devices comprises:

an array of non-volatile memory cells having series-coupled strings of non-volatile memory cells selectively coupled to two bit lines; and circuitry for control and/or access of the array of non-volatile memory cells, wherein the circuitry for control and/or access is configured to perform a method of reading a target memory cell of a string of series-coupled memory cells, the method comprising:

precharging a first bit line selectively coupled to one end of the string of memory cells using a first predetermined voltage;

selectively removing charge from, or adding charge to, the first bit line based on a data value of the target memory cell;

precharging a second bit line selectively coupled to an opposite end of the string of memory cells to a second predetermined voltage;

equalizing the first bit line with the second bit line; and determining the data value of the target memory cell in response to a voltage level of the second bit line after equalizing with the first bit line.

39. A memory module, comprising:

a plurality of contacts; and two or more memory devices, each having access lines selectively coupled to the plurality of contacts;

wherein at least one of the memory devices comprises:

an array of non-volatile memory cells having series-coupled strings of non-volatile memory cells; and circuitry for control and/or access of the array of non-volatile memory cells;

wherein the array of non-volatile memory cells comprises:

two bit lines selectively coupled to a first series-coupled string of non-volatile memory cells without making use of a source connection; and wherein a first end of the first series-coupled string of non-volatile memory cells is selectively coupled to a first bit line;

wherein a second end of the first series-coupled string of non-volatile memory cells is selectively coupled to a second bit line;

wherein a first end of a second series-coupled string of non-volatile memory cells is selectively coupled to the second bit line; and wherein the first end of the first series-coupled string of non-volatile memory cells is selectively coupled to the first bit line and the first end of the second series-coupled string of non-volatile memory cells is selectively coupled to a second bit line in response to the same control signal.

40. The memory module of claim 39, further comprising:

wherein a second end of the second series-coupled string of non-volatile memory cells is selectively coupled to the first bit line.

41. The memory module of claim 39, further comprising:

wherein a second end of the second series-coupled string of non-volatile memory cells is selectively coupled to a third bit line.

42. A memory module, comprising:

a plurality of contacts; and two or more memory devices, each having access lines selectively coupled to the plurality of contacts;

wherein at least one of the memory devices comprises:

an array of non-volatile memory cells having series-coupled NAND strings of non-volatile memory cells; and circuitry for control and/or access of the array of non-volatile memory cells;

wherein at least one NAND string comprises:

a first select gate for selectively coupling one end of the NAND string to a first bit line; and a second select gate for selectively coupling an opposite end of the NAND string to a second bit line, the second select gate comprising a first field-effect transistor and a second field-effect transistor coupled in series;

wherein one of the first and second field-effect transistors is an enhancement mode device and the other one of the first and second field-effect transistors is a depletion mode device.

43. A memory module, comprising:

a housing having a plurality of contacts; and one or more memory devices enclosed in the housing and selectively coupled to the plurality of contacts;

wherein at least one of the memory devices comprises:

an array of non-volatile memory cells having series-coupled strings of non-volatile memory cells selectively coupled to two bit lines; and circuitry for control and/or access of the array of non-volatile memory cells, wherein the circuitry for control and/or access is configured to perform a method of reading a target memory cell of a string of series-coupled memory cells, the method comprising:
- precharging a first bit line using a first predetermined voltage;
- selectively removing charge from, or adding charge to, the first bit line based on a data value of the target memory cell;
- precharging a second bit line to a second predetermined voltage;
- equalizing the first bit line with the second bit line; and
- determining the data value of the target memory cell in response to a voltage level of the second bit line after equalizing with the first bit line.

44. A memory module, comprising:
a housing having a plurality of contacts; and
one or more memory devices enclosed in the housing and selectively coupled to the plurality of contacts;
wherein at least one of the memory devices comprises:
- an array of non-volatile memory cells having series-coupled strings of non-volatile memory cells selectively coupled to two bit lines; and
- circuitry for control and/or access of the array of non-volatile memory cells, wherein the circuitry for control and/or access is configured to perform a method of reading a target memory cell of a string of series-coupled memory cells, the method comprising:
  - precharging a first bit line selectively coupled to one end of the string of memory cells using a first predetermined voltage;
  - selectively removing charge from, or adding charge to, the first bit line based on a data value of the target memory cell;
  - precharging a second bit line selectively coupled to an opposite end of the string of memory cells to a second predetermined voltage;
  - equalizing the first bit line with the second bit line; and
  - determining the data value of the target memory cell in response to a voltage level of the second bit line after equalizing with the first bit line.

45. A memory module, comprising:
a housing having a plurality of contacts; and
one or more memory devices enclosed in the housing and selectively coupled to the plurality of contacts;
wherein at least one of the memory devices comprises:
- an array of non-volatile memory cells having series-coupled strings of non-volatile memory cells; and
- circuitry for control and/or access of the array of non-volatile memory cells;
- wherein the array of non-volatile memory cells comprises:
  - two bit lines selectively coupled to a first series-coupled string of non-volatile memory cells with no intervening series-coupled string of non-volatile memory cells occurring between either bit line and the first series-coupled string of non-volatile memory cells; and
  - wherein a first end of the first series-coupled string of non-volatile memory cells is selectively coupled to a first bit line;
  - wherein a second end of the first series-coupled string of non-volatile memory cells is selectively coupled to a second bit line;
  - wherein a first end of a second series-coupled string of non-volatile memory cells is selectively coupled to the second bit line; and
  - wherein the first end of the first series-coupled string of non-volatile memory cells is selectively coupled to the first bit line and the first end of the second series-coupled string of non-volatile memory cells is selectively coupled to the second bit line in response to the same control signal.

46. The memory module of claim 45, further comprising:
wherein a second end of the second series-coupled string of non-volatile memory cells is selectively coupled to the first bit line.

47. The memory module of claim 45, further comprising:
wherein a second end of the second series-coupled string of non-volatile memory cells is selectively coupled to a third bit line.

48. A memory module, comprising:
a housing having a plurality of contacts; and
one or more memory devices enclosed in the housing and selectively coupled to the plurality of contacts;
wherein at least one of the memory devices comprises:
- an array of non-volatile memory cells having series-coupled NAND strings of non-volatile memory cells; and
- circuitry for control and/or access of the array of non-volatile memory cells;
- wherein at least one NAND string comprises:
  - a first select gate for selectively coupling one end of the NAND string to a first bit line; and
  - a second select gate for selectively coupling an opposite end of the NAND string to a second bit line, the second select gate comprising a first field-effect transistor and a second field-effect transistor coupled in series;
  - wherein one of the first and second field-effect transistors is an enhancement mode device and the other one of the first and second field-effect transistors is a depletion mode device.

49. An electronic system, comprising:
a processor; and
one or more memory device coupled to the processor, wherein at least one of the memory devices comprises:
- an array of non-volatile memory cells having series-coupled strings of non-volatile memory cells selectively coupled to two bit lines; and
- circuitry for control and/or access of the array of non-volatile memory cells, wherein the circuitry for control and/or access is configured to perform a method of reading a target memory cell of a string of series-coupled memory cells, the method comprising:
  - precharging a first bit line using a first predetermined voltage;
  - selectively removing charge from, or adding charge to, the first bit line based on a data value of the target memory cell;
  - precharging a second bit line to a second predetermined voltage;
  - equalizing the first bit line with the second bit line; and
  - determining the data value of the target memory cell in response to a voltage level of the second bit line after equalizing with the first bit line.

50. An electronic system, comprising:
a processor; and
one or more memory device coupled to the processor, wherein at least one of the memory devices comprises:
- an array of non-volatile memory cells having series-coupled strings of non-volatile memory cells selectively coupled to two bit lines; and circuitry for control and/or access of the array of non-volatile memory cells, wherein the circuitry for control and/or access is configured to perform a method of reading a target memory cell of a string of series-coupled memory cells, the method comprising:

precharging a first bit line selectively coupled to one end of the string of memory cells using a first predetermined voltage;

selectively removing charge from, or adding charge to, the first bit line based on a data value of the target memory cell;

precharging a second bit line selectively coupled to an opposite end of the string of memory cells to a second predetermined voltage;

equalizing the first bit line with the second bit line; and determining the data value of the target memory cell in response to a voltage level of the second bit line after equalizing with the first bit line.

51. An electronic system, comprising:

a processor; and one or more memory device coupled to the processor, wherein at least one of the memory devices comprises:

an array of non-volatile memory cells having series-coupled strings of non-volatile memory cells; and circuitry for control and/or access of the array of non-volatile memory cells;

wherein the array of non-volatile memory cells comprises:

two bit lines selectively coupled to a first series-coupled string of non-volatile memory cells with no intervening series-coupled string of non-volatile memory cells occurring between either bit line and the first series-coupled string of non-volatile memory cells; and wherein a first end of the first series-coupled string of non-volatile memory cells is selectively coupled to a first bit line;

wherein a second end of the first series-coupled string of non-volatile memory cells is selectively coupled to a second bit line;

wherein a first end of a second series-coupled string of non-volatile memory cells is selectively coupled to the second bit line; and wherein the first end of the first series-coupled string of non-volatile memory cells is selectively coupled to the first bit line and the first end of the second series-coupled string of non-volatile memory cells is selectively coupled to the second bit line in response to the same control signal.

52. The electronic system of claim 51, further comprising:

wherein a second end of the second series-coupled string of non-volatile memory cells is selectively coupled to the first bit line.

53. The electronic system of claim 51, further comprising:

wherein a second end of the second series-coupled string of non-volatile memory cells is selectively coupled to a third bit line.

54. An electronic system, comprising:

a processor; and one or more memory device coupled to the processor, wherein at least one of the memory devices comprises:

an array of non-volatile memory cells having series-coupled NAND strings of non-volatile memory cells; and circuitry for control and/or access of the array of non-volatile memory cells;

wherein at least one NAND string comprises:

a first select gate for selectively coupling one end of the NAND string to a first bit line; and a second select gate for selectively coupling an opposite end of the NAND string to a second bit line, the second select gate comprising a first field-effect transistor and a second field-effect transistor coupled in series;

wherein one of the first and second field-effect transistors is an enhancement mode device and the other one of the first and second field-effect transistors is a depletion mode device.

55. The memory device of claim 33, further comprising:

wherein the second end of the first series-coupled string of non-volatile memory cells is selectively coupled to the second bit line in response to two control signals and a second end of the second series-coupled string of non-volatile memory cells is selectively coupled to a bit line selected from the group consisting of the first bit line and a third bit line in response to two control signals; and wherein the two control signals are the same for both the first series-coupled string of non-volatile memory cells and the second series-coupled string of non-volatile memory cells.

* * * * *

UNITED STATES PATENT AND TRADEMARK OFFICE
CERTIFICATE OF CORRECTION

| | | |
|---|---|---|
| PATENT NO. | : 7,450,422 B2 | Page 1 of 1 |
| APPLICATION NO. | : 11/432135 | |
| DATED | : November 11, 2008 | |
| INVENTOR(S) | : Roohparvar | |

It is certified that error appears in the above-identified patent and that said Letters Patent is hereby corrected as shown below:

In column 15, line 21, in Claim 24, delete "sting" and insert -- string --, therefor.

Signed and Sealed this

Tenth Day of March, 2009

JOHN DOLL
*Acting Director of the United States Patent and Trademark Office*